United States Patent
Tanaka et al.

(10) Patent No.: US 11,584,693 B2
(45) Date of Patent: Feb. 21, 2023

(54) GROUP-III NITRIDE LAMINATE

(71) Applicant: SUMITOMO CHEMICAL COMPANY, LIMITED, Tokyo (JP)

(72) Inventors: Takeshi Tanaka, Hitachi (JP); Ryota Isono, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 156 days.

(21) Appl. No.: 16/906,247

(22) Filed: Jun. 19, 2020

(65) Prior Publication Data

US 2020/0399184 A1 Dec. 24, 2020

(30) Foreign Application Priority Data

Jun. 24, 2019 (JP) .............................. JP2019-116391

(51) Int. Cl.
| | |
|---|---|
| *H01L 29/778* | (2006.01) |
| *C04B 35/565* | (2006.01) |
| *C04B 35/581* | (2006.01) |
| *C04B 41/87* | (2006.01) |
| *C04B 41/88* | (2006.01) |
| *C04B 41/50* | (2006.01) |
| *B82Y 30/00* | (2011.01) |

(52) U.S. Cl.
CPC .......... *C04B 35/565* (2013.01); *C04B 35/581* (2013.01); *C04B 41/5025* (2013.01); *C04B 41/87* (2013.01); *C04B 41/88* (2013.01); *H01L 29/7786* (2013.01); *B82Y 30/00* (2013.01); *C04B 2237/08* (2013.01); *C04B 2237/363* (2013.01); *C04B 2237/366* (2013.01); *C04B 2237/406* (2013.01); *C04B 2237/704* (2013.01); *C04B 2237/72* (2013.01)

(58) Field of Classification Search
None
See application file for complete search history.

(56) References Cited

U.S. PATENT DOCUMENTS

| | | | |
|---|---|---|---|
| 2014/0183563 A1* | 7/2014 | Nakata | H01L 29/7786 257/77 |
| 2015/0041825 A1* | 2/2015 | Liu | H01L 29/7783 257/190 |
| 2015/0194493 A1* | 7/2015 | Sakaguchi | H01L 29/66462 257/194 |
| 2016/0240679 A1* | 8/2016 | Chen | H01L 29/205 |
| 2018/0366572 A1 | 12/2018 | Tanaka | |

FOREIGN PATENT DOCUMENTS

JP 2019-004118 A 1/2019

* cited by examiner

*Primary Examiner* — Seth Dumbris
(74) *Attorney, Agent, or Firm* — Foley & Lardner LLP

(57) ABSTRACT

There is provided a group III nitride laminate, including: a substrate comprised of silicon carbide; a first layer comprised of aluminum nitride and formed on the substrate; a second layer comprised of gallium nitride and formed on the first layer; and a third layer formed on the second layer and comprised of group III nitride having an electron affinity lower than that of the gallium nitride which is comprised in the second layer, the second layer having a thickness of less than 500 nm, the second layer containing iron at a concentration of less than $1 \times 10^{17}/cm^3$, and the second layer containing carbon at a concentration of less than $1 \times 10^{17}/cm^3$.

5 Claims, 3 Drawing Sheets

GROUP-III NITRIDE LAMINATE

BACKGROUND

Technical Field

The present disclosure relates to a group III nitride laminate.

Description of Related Art

An epitaxial substrate with group III nitride layers grown on a silicon carbide substrate has been developed. Such an epitaxial substrate is included in a device, as a material for manufacturing a semiconductor device such as a high electron mobility transistor (HEMT) (see Patent Document 1).

In the HEMT including such an epitaxial substrate, it is desired to suppress both leak current and current collapse.
[Patent Document 1] Japanese Patent Laid Open Publication No. 2019-4118

SUMMARY

An object of the present disclosure is to provide a technique of suppressing both leak current and current collapse in HEMT including an epitaxial substrate with group III nitride layers grown on a silicon carbide substrate.

According to an aspect of the present disclosure, there is provided a group III nitride laminate, including:
 a substrate comprised of silicon carbide;
 a first layer comprised of aluminum nitride and formed on the substrate;
 a second layer comprised of gallium nitride and formed on the first layer; and
 a third layer formed on the second layer and comprised of group III nitride having an electron affinity lower than that of the gallium nitride which is comprised in the second layer,
 the second layer having a thickness of less than 500 nm,
 the second layer containing iron at a concentration of less than $1 \times 10^{17}/cm^3$, and the second layer containing carbon at a concentration of less than $1 \times 10^{17}/cm^3$.

There is provided a technique of suppressing both leak current and current collapse in HEMT including an epitaxial substrate with group III nitride layers grown on a silicon carbide substrate.

BRIEF DESCRIPTION OF THE DRAWINGS

FIG. 2A illustrates a case of a present embodiment, and FIG. 2B illustrates a case of a comparative embodiment.

DETAILED DESCRIPTION OF THE DISCLOSURE

An Embodiment of the Present Disclosure

Figure 1:
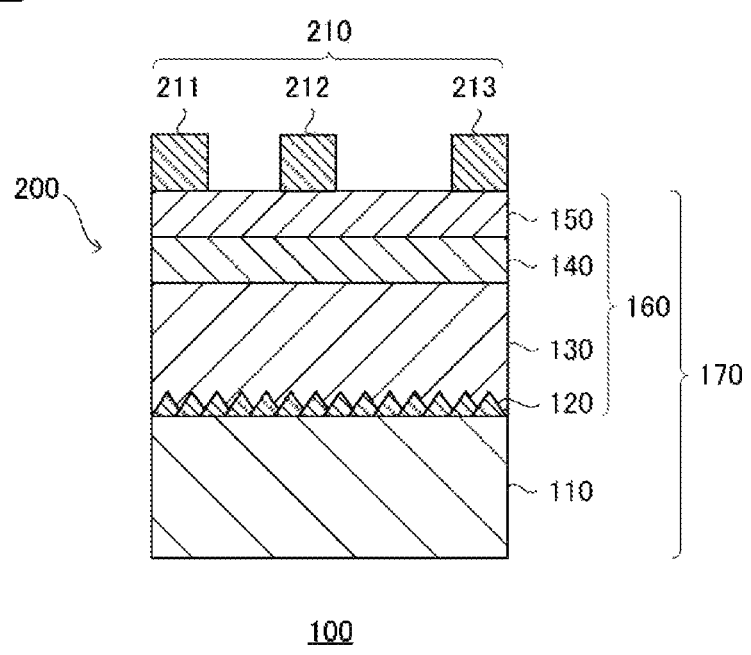
FIG. 1 is a schematic cross-sectional view illustrating a group III nitride laminate according to an embodiment of the present disclosure.

A group III nitride laminate 100 (also referred to as a laminate 100 hereafter) according to an embodiment of the present disclosure will be described. FIG. 1 is a schematic cross-sectional view illustrating a laminated 100. The laminate 100 includes a substrate 110 and a group III nitride layer 160 (also referred to as an epi layer 160 hereafter) comprised of group III nitride and formed on the substrate 110. The epi layer 160 includes (at least) a nucleation layer 120, a buffer/channel layer 130, and a barrier layer 140.

The laminate 100 may be, for example, in the form of an epitaxial substrate 170 (also referred to as an epi substrate 170 hereafter) including the substrate 110 and the epi layer 160. Also, the laminate 100 may be, for example, in the form of a semiconductor device including the epi substrate 170 as a material, more specifically, in the form of a high electron mobility transistor (HEMT) 200 including an electrode 210 (source electrode 211, gate electrode 212, and drain electrode 213) on or above the epi layer 160 (above the barrier layer 140). FIG. 1 illustrates the laminate 100 in the form of the HEMT 200. The laminate 100 in the form of the HEMT 200 may also be in the form of a wafer or in the form of chips obtained by dividing the wafer.

The substrate 110 is comprised of silicon carbide (SiC), and is a base substrate for heteroepitaxially growing the epi layer 160 thereon. As SiC comprised in the substrate 110, for example, polytype 4H or polytype 6H semi-insulating SiC is used. Here, "semi-insulating" means, for example, a state where a specific resistance is 105 Ωcm or more. The surface of the substrate 110, which is a base substrate for growing the epi layer 160 thereon, is formed as, for example, (0001) plane (a silicon surface of c-plane).

The nucleation layer 120 is formed on the substrate 110. The nucleation layer 120 is comprised of aluminum nitride (AlN), and functions as a nucleation layer that generates nuclei for crystal growth of the buffer/channel layer 130. Preferably, the nucleation layer 120 has a thickness of, for example, 1 nm or more and 200 nm or less.

The buffer/channel layer 130 (also referred to as a channel layer 130 hereafter) is formed on the nucleation layer 120. The channel layer 130 is comprised of gallium nitride (GaN). A lower side portion of the channel layer 130 functions as a buffer layer for improving crystallinity of an upper side portion of the channel layer 130. Further, the upper side portion of the channel layer 130 functions as a channel layer through which electrons travel during operation of the HEMT 200. A preferable thickness of the channel layer 130 according to the present embodiment will be described later.

The barrier layer 140 is formed on the channel layer 130. The barrier layer 140 is comprised of group III nitride having an electron affinity lower than that of GaN which is comprised in the channel layer 130, such as aluminum gallium nitride (AlGaN) containing aluminum (Al) and gallium (Ga) as group III elements. The barrier layer 140 induces a two-dimensional electron gas (2DEG) in the channel layer 130, and functions as a barrier layer for spatially confining the 2DEG inside the channel layer 130. Preferably, the barrier layer 140 has a thickness of, for example, 1 nm or more and 50 nm or less.

A cap layer 150 may be formed on the barrier layer 140, if necessary. That is, the epi layer 160 may include the cap layer 150, if necessary. The cap layer 150 is comprised of, for example, GaN, and in order to improve a device characteristics (controllability of a threshold voltage, etc.) of the HEMT 200, the cap layer 150 is interposed between the barrier layer 140 and the gate electrode 212.

On the cap layer 150 (above the barrier layer 140), a source electrode 211, a gate electrode 212, and a drain electrode 213 are formed as the electrode 210 of the HEMT 200. The gate electrode 212 is comprised of, for example, a Ni/Au layer which is a laminate of a nickel (Ni) layer and a gold (Au) layer. When the laminate is described as X/Y, it means that the laminating is carried out in an order of X and Y, in this specification.

Each of the source electrode 211 and the drain electrode 213 is comprised of, for example, a Ti/Al layer which is a laminate of a titanium (Ti) layer and an Al layer. Each of the source electrode 211 and the drain electrode 213 may be comprised by laminating a Ni/Au layer on the Ti/Al layer.

The channel layer 130 will be further described below. One feature of the laminate 100 of the present embodiment is that the channel layer 130 is thin. Specifically, the channel layer 130 has a thickness of less than 500 nm, preferably less than 450 nm, more preferably less than 400 nm, and even more preferably less than 350 nm.

In the laminate 100 according to a conventional technique (referred to as a comparative embodiment hereafter), the channel layer (buffer/channel layer) 130 is as thick as 500 nm or more. In the comparative embodiment, the channel layer 130 has a thickness of 500 nm or more, thereby reducing a defect such as a dislocation due to lattice mismatch, and thereby, a quality of a channel crystal portion arranged immediately under the barrier layer 140 is improved.

However, nitrogen vacancies existing in the channel layer 130, which is comprised of GaN, are donor-type point defects, and therefore when the channel layer 130 is thick as in the comparative embodiment, the leak current is increased in the HEMT 200. In the comparative embodiment, the channel layer 130 can have a high resistance by adding impurities such as iron and carbon to the channel layer 130 to suppress the leak current, thereby forming a deep energy level, and thereby capturing free carriers supplied from the nitrogen vacancies. However, according to this configuration, the deep energy level formed by impurities such as iron and carbon causes a transient response or decrease in a drain current, which is called current collapse. As described above, the laminate 100 of the comparative embodiment involves a problem that the leak current is large or the current collapse is large due to the thick channel layer 131 which is as thick as 500 nm or more.

In contrast, in the laminate 100 of the present embodiment, the leak current is suppressed due to thin channel layer (buffer/channel layer) 130 which is as thin as less than 500 nm, as compared with the comparative embodiment. Further, since the leak current is suppressed, impurities such as iron and carbon are not required to be added to reduce the leak current, and therefore the current collapse can also be suppressed as compared with the comparative embodiment. The concentrations of iron and carbon contained in the channel layer 130 according to the present embodiment are each less than $1 \times 10^{17}/cm^3$, from a viewpoint of suppressing the current collapse.

However, the crystallinity and the surface flatness of the channel layer 130 are likely to deteriorate due to the thinning of the channel layer 130. Therefore, in the present embodiment, by growing the epi layer 160 by the method described below, the deterioration of crystallinity and the deterioration of surface flatness of the channel layer 130 are suppressed even if the channel layer 130 has a thickness of less than 500 nm (high electron mobility is obtained by suppressing at least the deterioration of crystallinity). When the channel layer 130 is excessively thin, it is difficult to suppress the deterioration of crystallinity and the deterioration of surface flatness. Therefore, the channel layer (buffer/channel layer) 130 preferably has a thickness of 100 nm or more.

The degree of crystallinity of the channel layer 130 is evaluated, for example, by electron mobility through the channel layer 130. The electron mobility through the channel layer 130 according to the present embodiment is preferably 1500 $cm^2$/Vs or more, more preferably 1600 $cm^2$/Vs or more. Further, in the HEMT 200 including the channel layer 130 according to the present embodiment, the leak current is preferably $1 \times 10^{-5}$ A/mm or less. The leak current means an inter-element leak current or an off-leak current. The inter-element leak current can be measured in such a way that each element on the wafer is separated by ion implantation or ICP etching, etc., and thereafter a voltage of about 50 V is applied between ohmic electrodes of adjacent elements. The off-leak current can be measured in such a way that a sufficient negative voltage is applied to a gate electrode to pinch off the element in the formed transistor element, and thereafter a voltage of about 50 V is applied between the source and drain electrodes.

Figure 2A:
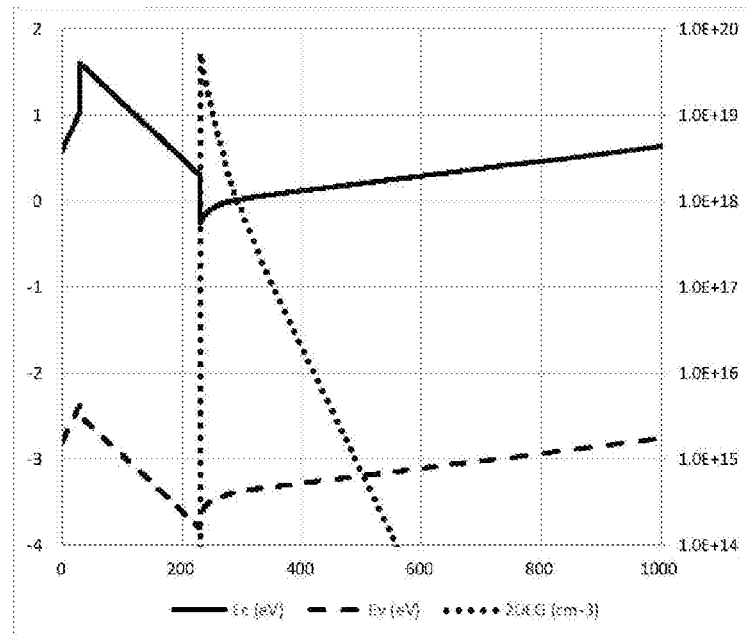
FIG. 2A and FIG. 2B are graphs (simulation results) showing a band structure and a 2DEG depth distribution of an epi layer in the III-nitride laminate.
Figure 2B:
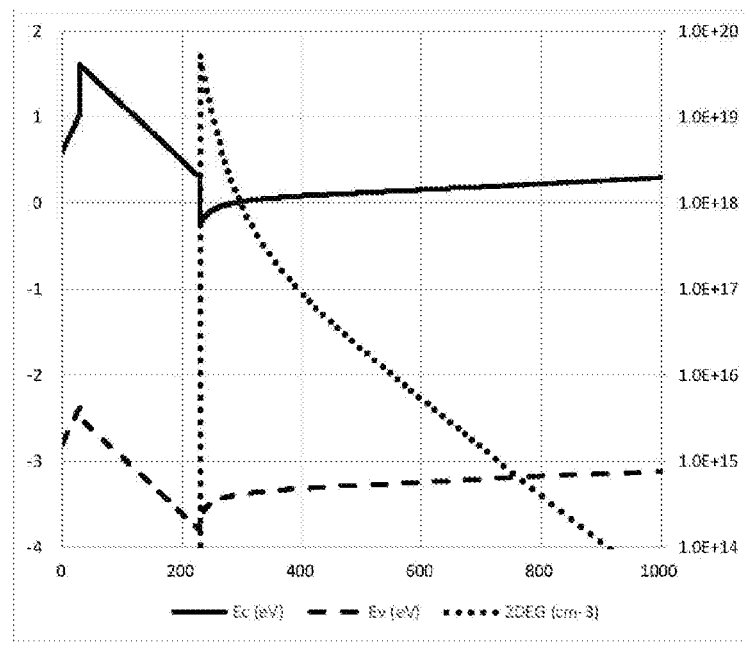

FIG. 2A and FIG. 2B are graphs (simulation results) showing a band structure (in the vicinity of the interface between the channel layer 130 and the barrier layer 140) and a 2DEG depth distribution of the epi layer 160 in the III-nitride laminate 100. FIG. 2A illustrates a case of the present embodiment (the channel layer 130 has a thickness of 400 nm), and FIG. 2B illustrates a case of a comparative embodiment (the channel layer 130 has a thickness of 1000 nm). The unit of the horizontal axis is Angstrom.

In the comparative embodiment (FIG. 2B), the hem of the 2DEG distribution extends to a lower side (substrate 110 side), compared to the present embodiment (FIG. 2A). That is, a range in which the electron concentration is high (for example, $1 \times 10^{16}/cm^3$ or more) extends to a lower side in the comparative embodiment than the present embodiment. Therefore, according to the comparative embodiment, the leak current becomes large because the current easily flows in an in-plane direction in the lower portion of the epi substrate 170, as compared with the present embodiment. In other words, according to the present embodiment, the leak current is suppressed because the current hardly flows in the in-plane direction in the lower portion of the epitaxial substrate 170, as compared with the comparative embodiment.

A method for manufacturing the laminate 100 according to the present embodiment will be described next. Here, the method for manufacturing the laminate 100 in the form of the HEMT 200 will be shown. A method for manufacturing the epi substrate 170 will be described first. A SiC substrate is prepared as the substrate 110. The epi substrate 170 is formed by growing the nucleation layer 120, the channel layer 130, the barrier layer 140, and (if necessary) the cap layer 150, which are the layers included in the epi layer 160, on or above the substrate 110 by, for example, metal organic chemical vapor deposition (MOVPE).

For example, a trimethylaluminum ($Al(CH_3)_3$, TMA) gas is used as an Al source gas out of the group III source gases. For example, a trimethylgallium ($Ga(CH_3)_3$, TMG) gas is used as a Ga source gas out of the group III source gases. For example, ammonia ($NH_3$) is used as a nitrogen (N) source gas, which is a group V source gas. For example, at least one of a nitrogen gas ($N_2$ gas) and a hydrogen gas ($H_2$ gas) is used as a carrier gas. Further, for example, an ammonia gas or a chlorine gas is used as a cleaning gas to perform cleaning described later. A growth temperature can be selected in a range of 900° C. to 1400° C., and a V/III ratio, which is a flow rate ratio of the group V source gas to the group III source gas, can be selected, for example, in a range of 10 to 5000. A ratio of a supply amount of each source gas is adjusted according to a composition of each layer to be formed. The thickness of each layer to be formed can be controlled by growth time, for example, by calculating the growth time corresponding to a designed thickness, from a growth rate obtained in a preliminary experiment.

The present inventors study on a method for suppressing the deterioration of crystallinity and the deterioration of surface flatness while thinning the channel layer (buffer/channel layer) 130 (to have a thickness of less than 500 nm) as described above. As a result, it is found that the deterioration of crystallinity and the deterioration of surface flatness of the channel layer 130 are suppressed by suppressing inclusion of Al into the channel layer 130, the inclusion of Al being caused due to formation of the nucleation layer 120 which is comprised of AlN. The reason is considered as follows: by suppressing the inclusion of Al during the growth of the channel layer 130 which is comprised of GaN, a two-dimensional growth of GaN is facilitated, and the crystallinity and the surface flatness of GaN are improved even in case of a thin layer. As a result, it can be considered that even in case of a thin channel layer 130 of less than 500 nm, good crystallinity of preferably 1500 $cm^2/Vs$ or more, more preferably 1600 $cm^2/Vs$ or more electron mobility can be exhibited.

Figure 3A:
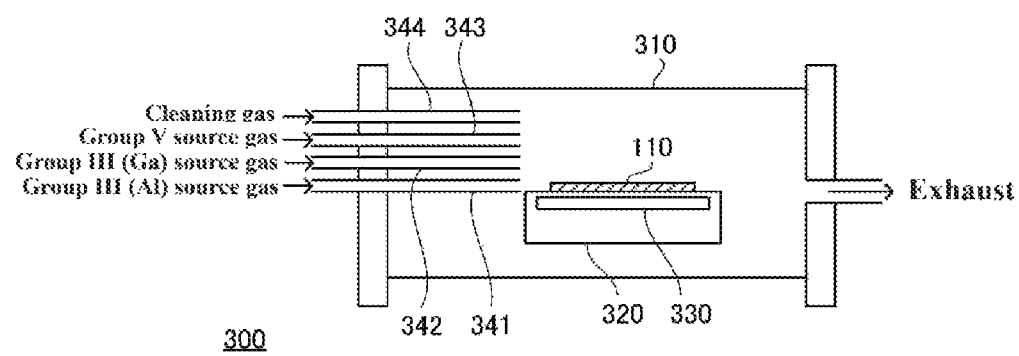
FIG. 3A is a schematic view conceptually illustrating a MOVPE apparatus used for manufacturing an epitaxial substrate included in the group III nitride laminate according to an embodiment.

A method for suppressing the inclusion of Al into the channel layer 130 will be exemplarily described hereafter. FIG. 3A is a schematic view conceptually illustrating a MOVPE apparatus 300 used for manufacturing the epi substrate 170 according to the present embodiment. A susceptor 320 for mounting the substrate 110 is installed in a reaction furnace 310 of the MOVPE apparatus 300. A heater 330 for heating the substrate 110 to a predetermined temperature is installed on a lower side of a mounting surface of the susceptor 320. Gas pipes 341, 342, 343, and 344 for supplying various gases toward the substrate 110 are introduced into the reaction furnace 310.

The gas pipe 341 supplies an Al raw material (for example, TMA) out of group III raw materials. The gas pipe 342 supplies a group III raw material other than the Al raw material, here, a Ga raw material (for example, TMG). The gas pipe 343 supplies a group V raw material (for example, $NH_3$). The gas pipe 344 supplies a cleaning gas to perform cleaning for removing the Al raw material adhered to a furnace wall, etc., of the reaction furnace 310.

Figure 3B:
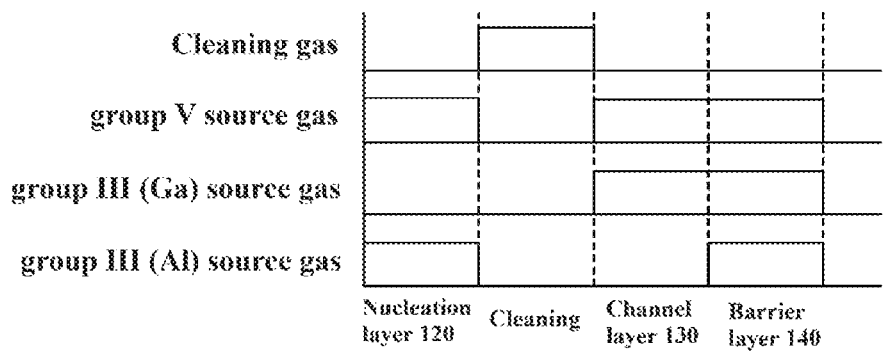
FIG. 3B is a schematic timing chart illustrating a growth step of the epi layer included in the group III nitride laminate according to an embodiment.

FIG. 3B is a schematic timing chart illustrating the growth step of the epi layer 160 according to the present embodiment. In the step of forming the nucleation layer 120, the nucleation layer 120 is formed by supplying the Al source gas and the N source gas toward the substrate 110 to grow AlN. Due to the formation of the nucleation layer 120, the Al raw material adheres to the furnace wall, etc., of the reaction furnace 310.

In the cleaning step following the step of forming the nucleation layer 120, the Al raw material adhered to the furnace wall, etc., of the reaction furnace 310 is removed by supplying a cleaning gas into the reaction furnace 310. When using a chlorine gas for cleaning, the cleaning step is performed in a state where the substrate 110 with the nucleation layer 120 formed thereon is taken out of the reaction furnace 310 once. The reason is that the nucleation layer 120 is prevented from being etched in the cleaning step. When using an ammonia gas for cleaning, the substrate 110 does not have to be taken out of the reaction furnace 310. It is more preferable to remove the Al raw material adhered to the inner wall of the gas pipe 341 by flowing the cleaning gas (for example, the ammonia gas or the chlorine gas) in the cleaning step, through the gas pipe 341 used for supplying the Al raw material in the step of forming the nucleation layer 120.

In the step of forming the channel layer 130 following the cleaning step, the channel layer 130 is formed by supplying the Ga source gas and the N source gas toward the substrate 110 to grow GaN. According to the present embodiment, the cleaning step is performed prior to the step of forming the channel layer 130 to remove the Al raw material adhered to the furnace wall, etc., of the reaction furnace 310, thereby suppressing the inclusion of Al during formation of the channel layer 130, and therefore the deterioration of the crystallinity of GaN and the deterioration of the surface flatness due to the inclusion of Al can be suppressed.

Further, according to the present embodiment, the gas pipe 341 for supplying the Al raw material gas and the gas pipe 342 for supplying the Ga raw material gas are separated. Thereby, the Al source gas remaining in the gas pipe can be prevented from being supplied together with the Ga source gas, which occurs in a mode in which the Al source gas and the Ga source gas are supplied from a common gas pipe, and therefore the deterioration of the crystallinity of GaN and the deterioration of the surface flatness in the channel layer 130 due to the inclusion of Al can be suppressed.

According to the present embodiment, as described above, the channel layer 130 having a thickness of less than 500 nm can be formed, with deterioration of crystallinity and surface flatness suppressed. In the cleaning step, various conditions such as a flow rate of the cleaning gas and a length of time for performing the cleaning step can be determined by preliminary experiments in order to form the channel layer 130 having predetermined crystallinity and surface flatness.

In the step of forming the channel layer 130, impurities such as iron and carbon for increasing the resistance of the channel layer 130 are not added. Regarding iron, the concentration of iron contained in the channel layer 130 is less than $1\times10^{17}/cm^3$ because the source gas containing iron (the source gas for adding iron) is not added. Further regarding carbon, the concentration of carbon contained in the channel layer 130 is less than $1\times10^{17}/cm^3$ because the channel layer 130 is grown at a growth temperature and a V/III ratio of suppressing the incorporation of carbon into the channel layer 130, the carbon being derived from a Ga source gas that is an organic source gas such as TMG.

In the step of forming the barrier layer 140 following the step of forming the channel layer 130, the barrier layer 140 is formed by supplying the Al source gas, the Ga source gas, and the N source gas toward the substrate 110 to grow AlGaN. When the epi layer 160 includes the cap layer 150, the cap layer 150 is formed by further supplying, for example, the Ga source gas and the N source gas toward the substrate 110 in the step following the step of forming the barrier layer 140. As described above, the epi substrate 170 is manufactured by growing the epi layer 160 on the substrate 110.

A method for manufacturing the HEMT 200 will be described next. After manufacturing the epi substrate 170, the HEMT 200 is manufactured by forming electrodes 210 (source electrode 211, gate electrode 212 and drain electrode 213) on the epi layer 160. When manufacturing the HEMT 200, other members such as a protective film may be formed, if necessary. The electrodes 210, the protective film, etc., may be formed by a known method. As described above, the laminate 100 according to the present embodiment is manufactured.

As described above, according to the present embodiment, since the channel layer 130 is thinned and has a thickness of less than 500 nm, the leak current can be suppressed when the laminate 100 is used as the HEMT 200. Further, since the leak current is suppressed, there is no need to add impurities such as iron and carbon to reduce the leak current, and therefore the current collapse can also be suppressed.

Preferable Aspects of the Present Disclosure

Preferable aspects of the present disclosure will be additionally described hereafter.

Supplementary Description 1

There is provided a group III nitride laminate, including:
a substrate comprised of silicon carbide;
a first layer comprised of aluminum nitride and formed on the substrate;
a second layer comprised of gallium nitride and formed on the first layer; and
a third layer formed on the second layer and comprised of group III nitride having an electron affinity lower than that of the gallium nitride which is comprised in the second layer,
the second layer having a thickness of less than 500 nm (preferably less than 450 nm, more preferably less than 400 nm, even more preferably less than 350 nm),
the second layer containing iron at a concentration of less than $1\times10^{17}/cm^3$, and
the second layer containing carbon at a concentration of less than $1\times10^{17}/cm^3$.

Supplementary Description 2

There is provided the group III nitride laminate according to the supplementary description 1, wherein the second layer has a thickness of 100 nm or more.

Supplementary Description 3

There is provided the group III nitride laminate according to the supplementary description 1 or 2, wherein an electron mobility through the second layer is preferably 1500 $cm^2$/Vs or more, more preferably 1600 $cm^2$/Vs or more.

Supplementary Description 4

There is provided the group III nitride laminate according to any one of the supplementary descriptions 1 to 3, including electrodes provided on or above the third layer, and used as a high electron mobility transistor.

Supplementary Description 5

There is provided the group III nitride laminate according to the supplementary description 4, wherein a leak current (off leak current) in the high electron mobility transistor is $1\times10^{-5}$ A/mm or less, the leak current being measured by applying a negative voltage to a gate electrode of the high electron mobility transistor to turn it off, and thereafter applying a voltage of 50 V between a source electrode and a drain electrode of the high electron mobility transistor.

What is claimed is:

1. A group III nitride laminate, comprising:
a substrate comprised of silicon carbide;
a first layer comprised of aluminum nitride, the first layer being directly on the substrate;
a second layer comprised of gallium nitride, the second layer being directly on the first layer; and
a third layer directly on the second layer and comprised of group III nitride having an electron affinity lower than that of the gallium nitride which is comprised in the second layer,
the second layer having a thickness of less than 500 nm,
the second layer containing iron at a concentration of less than $1\times10^{17}/cm^3$, and
the second layer containing carbon at a concentration of less than $1\times10^{17}/cm^3$.

2. The group III nitride laminate according to claim 1, wherein the thickness of the second layer is 100 nm or more and less than 500 nm.

3. The group III nitride laminate according to claim 1, wherein an electron mobility through the second layer is 1500 $cm^2$/Vs or more.

4. The group III nitride laminate according to claim 1, further comprising electrodes provided on or above the third layer, and wherein the group III nitride laminate is a high electron mobility transistor.

5. The group III nitride laminate according to claim 4, wherein the electrodes comprise a gate electrode, a source electrode and a drain electrode, and a leak current in the high electron mobility transistor is $1\times10^{-5}$ A/mm or less, the leak current being measured by applying a negative voltage to the gate electrode of the high electron mobility transistor to turn it off, and thereafter applying a voltage of 50 V between the source electrode and the drain electrode of the high electron mobility transistor.

* * * * *